US012724070B1

(12) United States Patent
Math et al.

(10) Patent No.: US 12,724,070 B1
(45) Date of Patent: Sep. 1, 2026

(54) SEAMLESS UNIVERSAL VERIFICATION METHODOLOGY

(71) Applicant: Amazon Technologies, Inc., Reno, NV (US)

(72) Inventors: Sneha Prabhu Math, San Jose, CA (US); Udhay Sankar Venugopal, Austin, TX (US)

(73) Assignee: Amazon Technologies, Inc., Reno, NV (US)

( * ) Notice: Subject to any disclaimer, the term of this patent is extended or adjusted under 35 U.S.C. 154(b) by 664 days.

(21) Appl. No.: 18/215,015

(22) Filed: Jun. 27, 2023

(51) Int. Cl.
*G01R 31/387* (2019.01)
*G01R 31/3183* (2006.01)
(Continued)

(52) U.S. Cl.
CPC ................ *G01R 31/318307* (2013.01); *G01R 31/318314* (2013.01); *G06F 30/3308* (2020.01);
(Continued)

(58) Field of Classification Search
CPC .... G01R 31/318307; G01R 31/318314; G01R 31/318357; G01R 31/3187;
(Continued)

(56) References Cited

U.S. PATENT DOCUMENTS 7,246,333 B2 * 7/2007 Bingham ................ G06F 30/33 716/106
7,526,742 B1 * 4/2009 Edwards ............... G06F 30/398 716/106

(Continued)

FOREIGN PATENT DOCUMENTS

CN 105320583 A * 2/2016
CN 106503308 A * 3/2017 ............ G06F 30/30

(Continued)

OTHER PUBLICATIONS

"UVM Testcases in the CORE-V_VERIF Environments", OpenHW Group, https://docs.openhwgroup.org/projects/core-v-verif/en/latest/uvm_tests.html, 2020-2021, 6 pages. (Year: 2020).*

(Continued)

*Primary Examiner* — Phallaka Kik
(74) *Attorney, Agent, or Firm* — Hogan Lovells Cadwalader US LLP

(57) ABSTRACT

Universal Verification Methodology (UVM) for testing an integrated circuit includes receiving a configuration object having an address map code. A template code is enabled to be associated with the testing and it includes at least specifications associated with the UVM. A utility module is compiled to provide a model and a testbench environment within the UVM, where the model and the testbench environment are represented by a first class script and that is based in part on input from the template code and from the configuration object. A change is determined in the configuration object and a second class script is automatically generated using the utility module and based in part on the change in the configuration object, where the specifications remain unchanged for the second class script. The integrated circuit is tested using the second class script.

20 Claims, 7 Drawing Sheets

(51) Int. Cl.

| | |
|---|---|
| ***G06F 11/25*** | (2006.01) |
| ***G06F 11/263*** | (2006.01) |
| ***G06F 11/267*** | (2006.01) |
| ***G06F 11/273*** | (2006.01) |
| ***G06F 30/3308*** | (2020.01) |
| ***G06F 30/331*** | (2020.01) |
| ***G06F 30/367*** | (2020.01) |
| ***G06F 30/398*** | (2020.01) |
| *G01R 31/3187* | (2006.01) |
| *G01R 31/319* | (2006.01) |
| *G06F 11/26* | (2006.01) |

(52) U.S. Cl.

CPC .. *G01R 31/318357* (2013.01); *G01R 31/3187* (2013.01); *G01R 31/31901* (2013.01); *G01R 31/31903* (2013.01); *G01R 31/31917* (2013.01); *G06F 11/25* (2013.01); *G06F 11/261* (2013.01); *G06F 11/263* (2013.01); *G06F 11/267* (2013.01); *G06F 11/273* (2013.01); *G06F 30/331* (2020.01); *G06F 30/367* (2020.01); *G06F 30/398* (2020.01)

(58) Field of Classification Search

CPC ........ G01R 31/31901; G01R 31/31903; G01R 31/31917; G06F 30/3308; G06F 30/331; G06F 30/367; G06F 30/398; G06F 11/25; G06F 11/261; G06F 11/263; G06F 11/267; G06F 11/273

USPC ...... 716/136, 106, 111, 117; 703/16, 17, 20; 714/30, 33, 732, 733, 734, 741

See application file for complete search history.

(56) References Cited

U.S. PATENT DOCUMENTS

| | | | | |
|---|---|---|---|---|
| 9,460,261 | B2 * | 10/2016 | Raghavan | G06F 30/398 |
| 9,547,041 | B2 * | 1/2017 | Siva | G01R 31/31727 |
| 9,836,372 | B1 * | 12/2017 | Khan | G06F 11/3604 |
| 10,289,779 | B2 * | 5/2019 | Wolff | G06F 13/42 |
| 10,310,014 | B1 * | 6/2019 | Kumar | G06F 30/00 |
| 11,250,191 | B1 * | 2/2022 | Bachchu | G06F 30/327 |
| 2015/0294039 | A1 * | 10/2015 | Arbel | G06F 30/3323 703/14 |
| 2015/0302126 | A1 * | 10/2015 | Hamid | G06F 11/3688 716/136 |
| 2015/0324505 | A1 * | 11/2015 | James | G06F 30/33 716/103 |
| 2016/0328505 | A1 * | 11/2016 | James | G06F 30/36 |
| 2017/0115969 | A1 * | 4/2017 | Pendharkar | G06F 8/35 |
| 2017/0255731 | A1 * | 9/2017 | Chou | G06F 30/367 |
| 2017/0316137 | A1 * | 11/2017 | James | G06F 30/367 |
| 2018/0203964 | A1 * | 7/2018 | Chou | G06F 30/39 |
| 2018/0203967 | A1 * | 7/2018 | Chou | G06F 9/3802 |
| 2019/0286761 | A1 * | 9/2019 | Chou | G06F 30/39 |
| 2019/0286775 | A1 * | 9/2019 | Chou | G06F 30/39 |
| 2019/0384598 | A1 * | 12/2019 | Chou | G06F 30/367 |
| 2020/0272701 | A1 * | 8/2020 | Robertson | G06F 30/3323 |

FOREIGN PATENT DOCUMENTS

| | | | | |
|---|---|---|---|---|
| CN | 104268310 B | * | 8/2017 | |
| CN | 109901999 A | * | 6/2019 | |
| CN | 110263459 A | * | 9/2019 | G06F 30/398 |
| CN | 112069074 A | * | 12/2020 | G06F 11/3684 |
| CN | 112527723 A | * | 3/2021 | G06F 11/3656 |
| CN | 114996074 A | * | 9/2022 | G06F 11/261 |
| CN | 116070564 A | * | 5/2023 | G06F 30/3308 |
| CN | 118627440 A | * | 9/2024 | G06F 30/367 |
| CN | 113673189 B | * | 10/2024 | G06F 30/33 |

OTHER PUBLICATIONS

Fitzpartick et al., "How to Creat a Complex Testbench in a Couple of Hours", Mentor, Design and Verification Conference and Exhibition, Europe, 2017, 70 pages. (Year: 2017).*

Rosselli, et al., "A single generated UVM Register Model to handle multiple DUT configurations", Design and Verification Conference and Exhibition United States, 2020.

Saheel, et al., "Hardware Acceleration for UVM Based CLTs", "A single generated UVM Register Model to handle multiple DUT configurations", Design and Verification Conference and Exhibition United States, 2020.

Mishra, "Automation of the UVM Register Abstraction Layer", May 2020.

Corsair. "Control and Status Register map generator for HLD Projects", https://corsair.readthedocs.io/en/latest/contributing.html#documentation, Jun. 26, 2023.

Verification Academy, "What is the best way to make register write/read sequences generic?", https://verificationacademy.com/forums/uvm/what-best-way-make-register-write/read-sequences-generic, Jun. 26, 2023.

Agnisys, "The IC Designer's Guide to Automated Specification of Design, Verification, and Validation for Better Products", Jun. 26, 2023.

Sinari, et al., "Automated Generation of RAL-based UVM Sequences", Jun. 26, 2023.

* cited by examiner

SEAMLESS UNIVERSAL VERIFICATION METHODOLOGY

BACKGROUND

Universal Verification Methodology (UVM) may be used with a Register Abstraction Layer (RAL) and Control and Status Register (CSR) packages to perform design and verification of digital integrated circuits. RAL may be used to access registries of the CSR. Further, a hardware description language (HDL), such as Verilog® and VHDL®, may be used with the RAL package to perform tests on integrated circuit within designs under test (DUT). The CSR package enables design and verifying of control and status registers (CSRs), which are components used in digital integrated circuits for controlling and capturing aspects of an integrated circuit. For example, CSRs may provide configuration, monitoring, and debugging for the integrated circuit and the CSR package enables design and verification of the CSRs by a set of classes and methods associated there with. In an example, the CSR package may be used to create register models that represent behaviors of the CSRs for verification, such as to check accessibility, validating read/write operations, and verifying the interaction of registers with other parts of an integrated circuit design.

BRIEF DESCRIPTION OF THE DRAWINGS

Embodiments herein will be described with reference to the drawings, in which.

DETAILED DESCRIPTION

Figure 1:
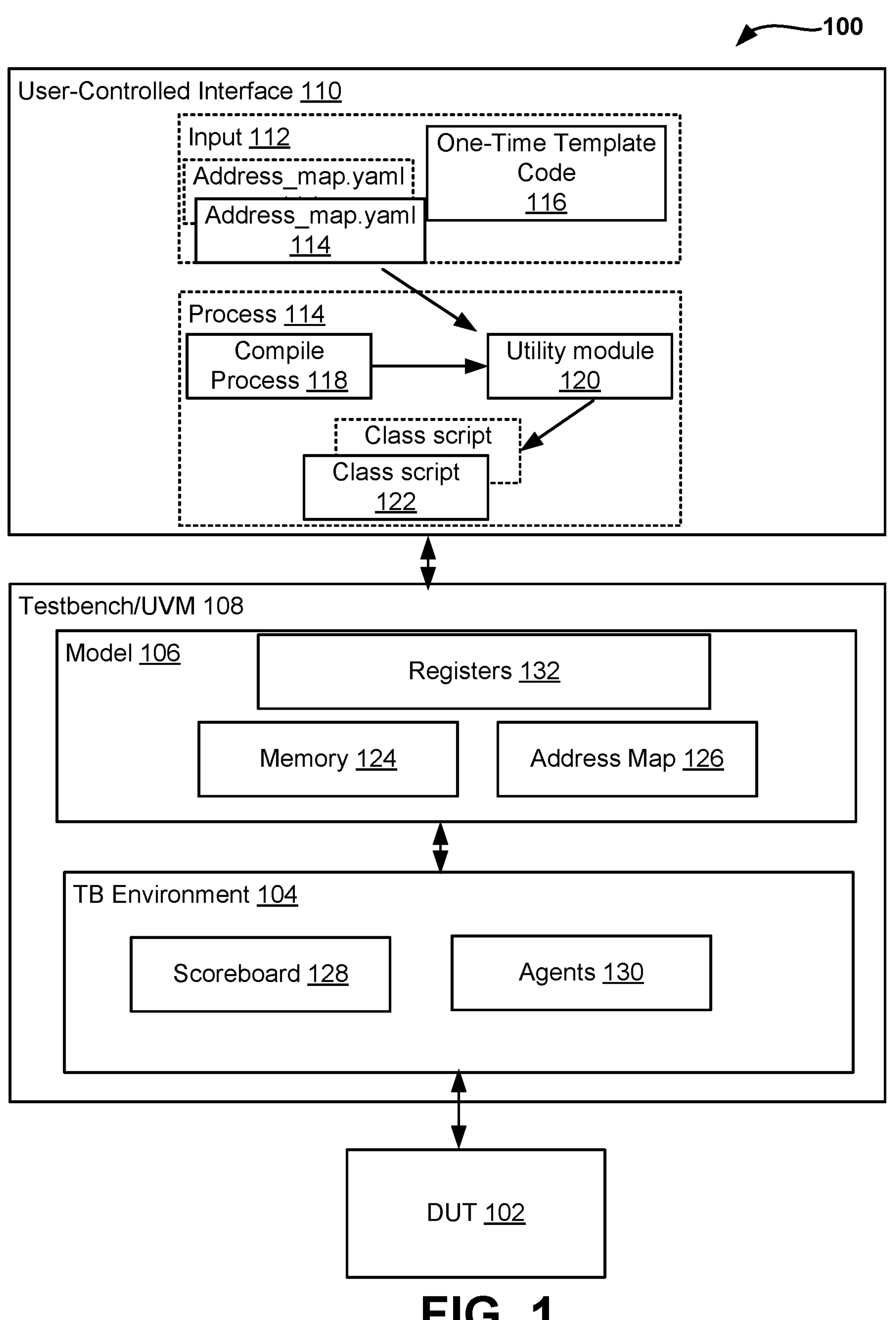
FIG. 1 illustrates a block diagram of a system for seamless universal verification methodology, in accordance with at least one embodiment.

Systems and methods in accordance with at least one embodiment presented herein overcome one or more of the above-described deficiencies and other such deficiencies in existing approaches for performing, without limitation, universal verification methodology (UVM). For example, seamless UVM for testing an integrated circuit can include receiving a configuration object having an address map code. A template code can be associated with the testing and can include at least specifications associated with the UVM. A utility module can be compiled to provide a model and a testbench environment within the UVM, where the model and the testbench environment are represented by a first class script and the utility module is based in part on input from the template code and from the configuration object. A change can be determined in the configuration object, and a second class script can be automatically generated using the utility module and based in part on the change in the configuration object, where the specifications remain unchanged for the second class script. The integrated circuit can then be tested using the second class script.

In at least one embodiment, a computer-implemented method for seamless UVM includes compiling a utility module to provide a model and a testbench environment within a UVM system. The UVM system may be a based in part on a simulation performed on at least one processor using instructions in a memory. The model and the testbench environment can be represented by different classes of a first class script, and the utility module can be based in part on input from a template code and input from a configuration object. The configuration object includes an address map code and the testbench environment comprising agents to test an integrated circuit using the UVM system. Such a method can include determining a change in the configuration object and automatically generating a second class script using the utility module. The second class script is automatically generated based in part on the change in the configuration object. Specifications in the template code, however, can remain unchanged for the second class script. Such a method can involve executing the second class script to test the integrated circuit.

In at least one embodiment, such a method and system can address testing of register and memories that form an intrinsic part of Machine Learning (ML) hardware. Thorough testing of such basic building blocks may be performed for every generation of circuits, including for application-specific integrated circuits (ASICs). However, register and memories may often change as a project progresses for circuit design. While upkeep may be performed, such upkeep requires human intervention that is error prone. The seamless UVM approach herein enables automatic generation of at least register models, including for CSR (Control and Status Register) tests, but extends further register and memory tests by maintaining a testbench environment. For example, using an address map as input, a utility module or tool is provided that can generate updated UVM test infrastructure, at least as to the register model, upon every change in a configuration object having at least an address mapping, in the form of a code. The configuration object may include register transfer language (RTL) code or YAML Ain't Markup Language® code. A scanning approach or a notification approach may be used to determine a change in the configuration object by a user-controlled interface. The class scripts that are generated based at least in part on changes to the configuration object can provide updated UVM test infrastructure along with RTL/address map changes so that new register map changes become seamless. Moreover, it is possible to randomize aspects of the register model, such as clocking aspects, for robust testing or verification of circuits in a DUT using the seamless UVM.

Various other functions and advantages are described and suggested below as may be provided in accordance with at least one embodiment herein. In the description herein, at least one embodiment may be described and performed according to the disclosure herein. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates a block diagram of a system 100 for seamless universal verification methodology (UVM), in accordance with at least one embodiment. The system 100 includes a user-controlled interface 110 capable of receiving user input 112 and a process interface 114 that may be separate or together with a testbench/UVM module 108. In at least one embodiment, the user input 112 and a process interface 114 providing the user-controlled interface 110 may be part of a host machine, whereas the testbench/UVM module 108 may be part of a cloud computing environment providing simulation services. Alternatively, the user-controlled interface 110 may be part of a same host machine configured to provide the testbench/UVM module 108 as a simulation. Still further, all aspects in FIG. 1 may be provided in a cloud computing environment using virtual instances associated with bare metal resources remote from a user.

The testbench/UVM module 108 may be part of a dynamic verification approach that may be performed using directed or random stimuli to an integrated circuit design that is under test or verification (DUT) 102. Dynamic verification may be performed using simulation, such as using a register transfer language (RTL) coded simulation. Directed stimuli may be static so that a result remains the same on every simulation that is performed using the input. Directed stimuli may be used for verification performed on IP (Intellectual Property) block data. Further, in use case of directed stimuli, the data and configuration may be provided via the user input 112. However, random data may be used in the case of the random stimuli approach.

In addition, a system on chip (SoC)-related CSR testing or verification may be performed using the seamless UVM approaches herein. The SoC interface may exist between processors and other IPs of an integrated circuit, such as peripheral devices. The SoC may include a number of CSRs that may be provided by a memory 124 for testing and may be associated with an address map 126. An external verification IP (VIP) may be used for such testing or verification. However, there may be no available VIP for a certain SoC. Approaches herein allow testing by reconfiguring the memory or address map without changing other aspects of the testing or verification. For example, the register model 106 may be changed with the TB environment 104 reused. Further, it is possible to randomize aspects of the memory or address map to generate VIPs for the SoC that includes the CSRs.

The UVM provides a user with the ability to generate a testbench (TB) environment 108 using phasing, sequencers and sequence items to test registers associated with the DUT 102. The DUT 102 may be performed in the same host machine having the user-controlled interface 110 and the testbench/UVM module 108, as part of distinct or the same simulation. However, the DUT 102 may be part of an emulator that is distinct from the host machine. For example, the DUT 102 may include logical gates and flip-flops represented in simulation. The TB environment 108 enables analyses of each applied value to each register and memory model provided to determine errors. Therefore, one or more aspects of the user-controlled interface 110, the testbench/UVM module 108, and the DUT 102 may be in a cloud computing environment that is distinct from a host machine that may only provide the user input 112 interface.

Further, third-party IP block data may be used in the tests performed using the testbench/UVM module 108 during circuit design. One or more UVM agents 130 may be configured to perform the tests using an associated driver. A driver can receive input from a sequencer of one of the agents 130 and can translate the input to provide an output suitable to the DUT 102, such as to an emulator or a simulator based in part on an interface between the testbench/UVM module 108 and the DUT 102 that will be readily appreciated by a skilled artisan reviewing this description. In at least one embodiment, the driver enables an emulation or simulation of the DUT 102 to receive transactions, such as those referenced in a class script.

The DUT 102 may execute the transactions to perform the testing within the emulation or simulation. For example, the DUT 102 may sample and drive ports associated with the DUT 102 to perform a read and write transfer on a data bus. In at least one embodiment, as such, the driver is fully in control of the address lines, data lines, and related strobes. Further, the transactions, representing inputs and outputs with respect to a DUT 102, may include data packets for a network, bus access protocols, among other instructions. The transactions may include fields and attributes that may be derived from a specification related to the testing feature in the DUT 102. For example, for Ethernet related aspects, the specifications may be taken from a standard and may include values and attributes for data packets associated with that standard.

In at least one embodiment, at least one of the agents 130 is passive and is able to monitor outputs pertaining to the testing in the DUT 102. Each of the agents 130 may include a sequencer and a monitor, along with the driver. Further, the TB environment 104 may include a scoreboard 128, which is a collective monitor to receive testing related feedback or analysis of the ports interfacing with different agents 130. The sequencer may be referred to as a virtual sequencer and is able to generate the transactions, as well as control such transactions with respect to the driver.

A sequencer can also rely on provided features in the TB environment 104 to react on a state of a DUT 130 based at least in part on each transaction associated with the agent to which it is a party. In at least one embodiment, a sequence may be defined based in part on the class script provided from the system and method herein. For example, the sequence may include an order for the transactions so as to be able to generate a pattern of stimuli. Further, in at least one embodiment, the sequences may be defined, in part, in a template code or a related configuration object that can be retained and that can be reused. The virtual sequencer, in particular, may allow synchronization of testing-related control for multiple components of the DUT 102.

The monitor is enabled to sample the output of the DUT 102. As such, the monitor can capture traffic that it can relate to the transactions associated with its respective agent. The traffic may be made available to the scoreboard 128 to enable the verification aspects described herein. Further, the monitor can also work with a virtual sequencer to provide a sequence using a port based in part on an indication in the monitor of an event on a different port but that is associated with the same agent. A predictor may be associated with the agents 130 and with the scoreboard. The predictor is also able to receive information from the monitor and, based in part on changes in values in one or more registers of a DUT 102, it can provide such information to the model 106 feature of the testbench/UVM 108. As such, at least one of the classes of the class script includes a predictor class with parameters that may be associated with a transaction class.

The predictor may be used to ensure consistency of the traffic between the interfaces of the DUT 102 and the agents.

The TB environment 104 may be enabled by classes of the class script herein. The TB environment 104 is a parent class that can include agents 130 as classes, along with the monitors and sequencers. In at least one embodiment, a configuration of the TB environment 104 may be customized via the class script to define its behavior and topology that may be specific to a test to be conducted for a DUT 102. In at least one embodiment, the class script enables a function of a TB environment 104 to generate and provide test traffic to stimulate the DUT 102, which enables a further function to monitor a response from the DUT 102, and enables yet another function to check that the test traffic and the response are according to specifications intended for the DUT 102.

In at least one embodiment, the model 106 and the TB environment 104 are abstractions provided by the class script. Reference to a class script herein is understood to be a plural reference where classes of the class script may be in individual files but together form the class script. For example, a umv_mem class provides the memory 124 of the model 106 within the testbench/UVM 108. However, a uvm_mem class may be in its own file, but is still part of a class script, in at least one embodiment. Similarly, a uvm_reg_map class provides the address map 126. Further, a uvm_reg class provides the registers 132 and may be associated with a class field and may include one or more other classes, altogether representing a class script.

Further, the memory 124 (uvm_mem class) and registers 132 (uvm_reg) classes offer differences in that a physical storage is accessible using uvm_mem class. There may be more resource usage as a result of an address mapping to uvm_mem class. However, the uvm_mem class may not support prediction and shadow storage functions for a mirror value and expected value. Additionally, the uvm_mem class is able to use a built-in method of the testbench/UVM 108 to access hardware storage associated with the system herein.

The uvm_reg class may provide the registers 132 by relying on an RTL state and may not provide a reference storage. As a result, access to a memory 124 may be performed using application programming interface (API) methods, including to read and write, as well as in support of PEEK and POKE commands. Relative to the memory 124, the registers 132 (uvm_reg class) can support get, set, mirror, predict, and update commands for verification or testing. A register of the provided registers 132 is referenced by a single address, whereas the memory 124 may include a range of addresses.

The model 106, therefore, includes registers under simulation as individualized Object Oriented Programming (OOP) classes with fields therein. A field may be an instance that enables values associated with a bit position, a reset, an access, or other functionality. The model 106 enables a mapping between the registers 132 and the address map 126. This enables simulated read/write accesses to occur using names of the registers (or fields) without hard-coded addresses and offsets. Further, when access is requested for a particular field, a class can enable the access to a register address but also masks bits that are not associated with a field under access.

In at least one embodiment, FIG. 1 also illustrates aspects performed in the user-controlled interface 110. For example, an input 112 part of the user-controlled interface 110 allows input for an address_map.yaml configuration object 114. As described further in FIG. 2A, the configuration object 114 may include an address map code. The configuration object 114 is to be used to test an integrated circuit using the testbench/UVM 108 herein. In at least one embodiment, the address map code may be changed to cause updates to the addres_map.yaml configuration object 114. This may be to provide randomization of registers in the model 106 for the register access and testing. For example, by changing the configuration object 114 and retaining the template code, a random configuration of registers (or changes within the registers) for verification may be mapped between the TB environment 104 and the DUT 102.

In at least one embodiment, the random configuration, as described to the registers, provides that multiple register components under verification are subject to similar configuration changes, which ensures consistency throughout the address map 126 even if changes do occur to certain registers in the address mapping 126. In at least one embodiment, therefore, such approaches rely on randomization of address mapping for the registers 132 as against the DUT 102 to cause changes in the registers without changing specific registers. This may be based on an initial address map 126 that may be changed in a subsequent cycle of the verification herein so that a different register than an initial register is mapped to the integrated circuit of the DUT 102. Therefore, the simulation in the TB environment 104 and the DUT 102 includes representations of updated register testing for the same simulated circuit, based on the randomized register selection within the integrated circuit of the DUT 102.

In at least one embodiment, randomizing herein may rely on a constrained random value approach to ensure that randomness remains within the registers available in the DUT 102. Further, while the model 106 is a set of classes of a class script that may include multiple class files, these may include extended base classes. As there are many registers under test at the same time, the model 106 may be generated from and updated in a cyclic manner for the verification environment. For example, at least one register in an integrated circuit may include at least one field for indicating a start of a block of registers. A control register may include fields indicative of a configuration it is intended to project. Separately, a state register may be a read-only register to return a current state of the control register, for instance. Other registers, including the control register, may store timing information, including as to clock domains and frequencies. As a result of such different feature, the registers 132 and address map 126 must be coordinated to ensure proper testing and verification to suit the DUT 102.

In at least one embodiment, it is possible to verify or test a third-party IP within an SoC by randomizing the register model 106. For example, certain CSR or other registers may be randomly changed to support different field lengths, so as to be able to represent different Baud rates, stop bits, parity bits, and character lengths that may be associated with changed clock domains or frequencies. One or more of such testing and verification may be applied to ensure integrity between hardware components, such as integration of a controller within an SoC. In at least one embodiment, the model 106 may represent an external system to provide memory or register configuration of the registers 132, the memory 124, and the address map 126 to a DUT 102. The DUT 102, in turn, updates its registers or memories based at least in part on the memory or register configuration of the register model 106. The updates represent an integrated circuit under test or an output may be read using a processor in communication with a bus interface for an emulator, for instance.

In at least one embodiment, a template code 116 may be a one-time template code that is provided to work with multiple address_map configuration objects 114. The template code may be associated with a testing to be performed for a DUT 102. The template code may include at least specifications associated with the UVM 108 to be used with the DUT 102. For example, the template code may provide the rest of a class structure to enable the environment, such as the stimulus and the sequencer, the predictor, and the monitor. In at least one embodiment, the template code 116 may be provided from a Python®-related templating engine. The configuration object 114 may be presented as in YAML® or RTL format. The utility module 120 may therefore comprise Python® code that is based in part on input from the template code and from the configuration object. A compile process 118 of the process block 114 may be provided to compile the utility module 120.

In at least one embodiment, the compilation performed by the compile process 118 provides a model 106 and a TB environment 104 to be used within the testbench/UVM 108. In at least one embodiment, the model 106 and the TB environment 104 are represented by a first class script 122 that may comprise one or more classes. In turn, the one or more classes are comprised in one or more class files, all representing the class script 122. As the compile process 118 used, as input, the template code and from the configuration object, the utility module that provides the class script 122 is based in part on the input from the template code and from the configuration object.

To perform the randomization described with respect to the register configuration, a determination of a change in the configuration object may be determined. For example, a second configuration object 114B may be provided with changes within the address_map.yaml, relative to a first configuration object 114A. The changes may be automatically generated by a constrained randomization. In at least one embodiment, the template code 116 may remain the same and is reused. The compile process 118 is enabled to automatically generate a second class script 122 using the utility module and based in part on the change in the configuration object 114B. As the template code 116 remains the same, the specifications of the TB environment 104 may remain unchanged for the second class script. The test or verification, with respect to the integrated circuit of the DUT 102, proceeds with the second class script 122.

In at least one embodiment, the specifications of the template code 116 may include SoC (System On Chip) or IP (Intellectual Property) block data for testing SoC or IP blocks associated with the integrated circuit of the DUT 102. Further, the class script 122 may include testing requirements within the model 106 and within the TB environment 104 for a control and status register (CSR) of the integrated circuit. #In at least one embodiment, the registers 132 are associated with a dedicated CSR block of the DUT 102. The CSR arrangement is based in part on the address map 126. The CSR enables aspects of hardware and software where program and control for functionalities within a system may be provided by the status of the CSR. For example, a CSR may be accessed in a read operation to determine a status of an action, such as an interrupt action. An interrupt may be provided upon finishing an action that may be associated with a larger task. The setting or resetting of bit(s) of a field of a CSR may indicate such information and verification of each CSR is required to ensure integrity of an integrated circuit and of a system or application that uses the integrated circuit.

In at least one embodiment, the utility module 120 may include a macro-based utility to provide an expansion sequence within the template code. For example, aspects of the configuration object 114 may be inserted within a macro, with aspects of the template code providing a wrapper. Further, the address map 126 that may be enabled by the class script 122 includes addresses and values for registers within the integrated circuit of the DUT 102 and that are mapped to the registers 132 of the model 106. The change in the configuration object 114 allows the second class script 122 to change a memory content of the memory 124 class and an address map content of the address map 126 class of the model 106, relative to the first class script that provided the memory 124 and the address map 126.

Figure 2A:
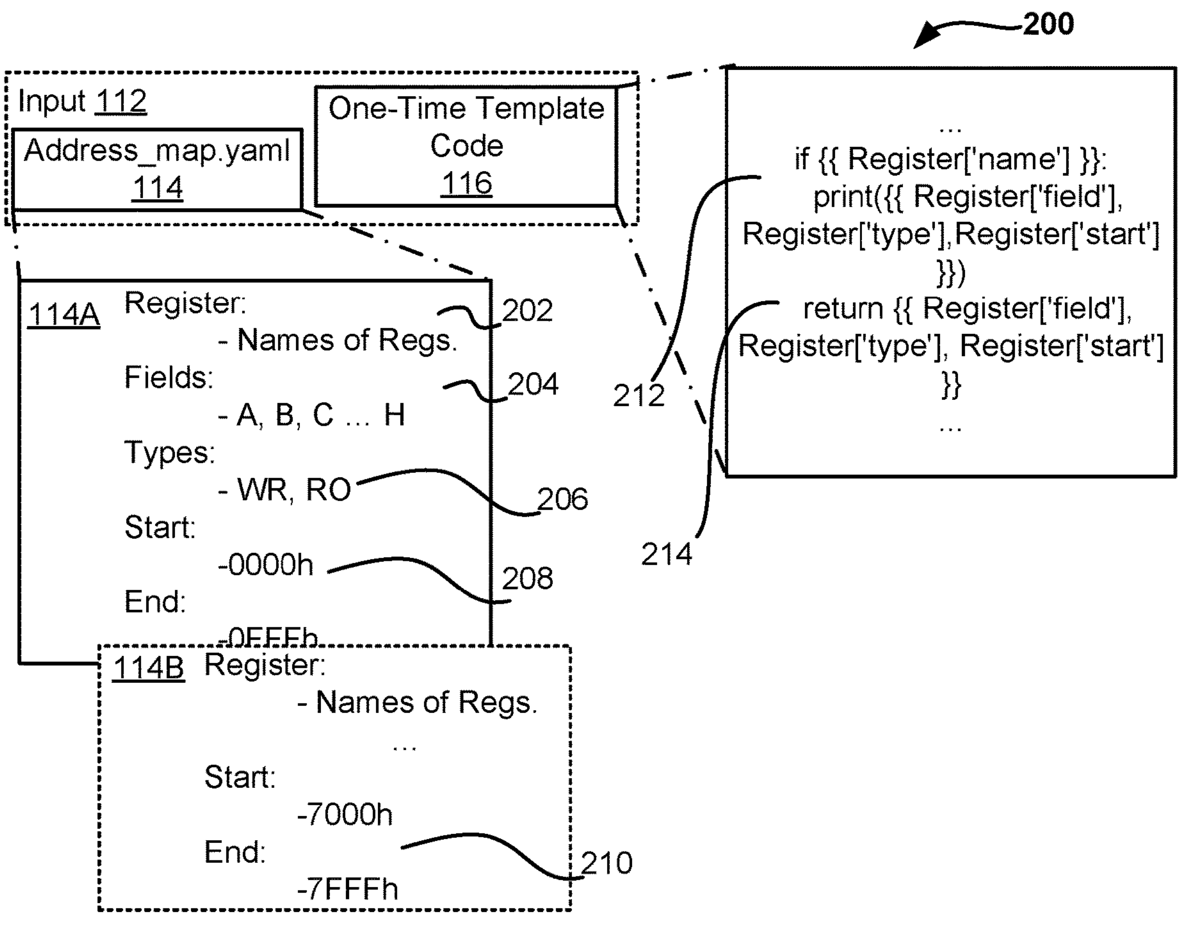
FIG. 2A illustrates details associated with a system for seamless universal verification methodology, in accordance with at least one embodiment.

FIG. 2A illustrates template code and configuration object details 200 associated with a system for seamless UVM, in accordance with at least one embodiment. While illustrated as if in plaint text, the configuration object 114 is a serialization format configuration file to pass configuration information of one or more registers to a class script for deployment in the simulation testing or verification of a CSR, for instance. As illustrated, the configuration object 114 is interchangeably used with the address map and it describes the registers by name, fields, types, and addresses 202-208.

In at least one embodiment, each register 132 may be subject to a script class. However, a register block may be defined so that it includes access to multiple registers for read and write operations of the testing or verification herein. Further, the registers 132 may include a mode register and a halt register, other than the CSR. The registers may have different fields that support different bit widths. For example, the fields may be for enable, for power mode, for interrupts, and other requirements. In at least one embodiment, some of the addresses belonging to some registers or memory are pertinent to certain SoC components.

In at least one embodiment, the ability to randomize the register model 106 can enable randomizing of various combinations of hardware features, such as a clock features that may not be provided with a third-party VIP. For example, certain controller components require specific clock signaling. An address map 114 may be provided for testing or verification of such a controller component that requires space to store message strings of certain length. This allows control information to be provided and allows status information to be retrieved beneficially from an SoC after simulation.

For example, the address map 114 can provide different registers 114A, 114B, at different times, used for the testing or verification of clock signals for an integrated circuit of a DUT 102. The provided registers may be CSR that may be used to control a clock, for instance, as part of the testing or verification. Therefore, different clock frequencies for a clock to be part of an SoC may be provided by changing the register model 106 and particularly, to do so randomly. This approach also enables a Baud rate for testing or verification using registers to provide various combinations of stop bits, parity bits, and character lengths associated with a clock frequency to be used.

The randomization and a result of the testing or verification may be provided to a client device through a provided port. Alternatively, a monitor can serialize the randomization and result to a memory of the SoC to enable self-check. This allows a register model for clock generation and checking for specific components without a third-party VIP, for instance. A register model, once executed, can enable different frequencies for clocks to test clock domains for different circuits in the DUT 102.

FIG. 2A also illustrates that different fields 204 of each register 202 may include different types 206 (indicating read or write capability) and may include start and end addresses 208 associated there with. The different addresses 208 can reflect different bit lengths associated with different CSR requirements for an integrated circuit of a DUT 102, including with clock cycles, clock counter, frequency, and other aspects of control and/or status requirements for one or more components. In at least one embodiment, changing the start and end addresses from a first configuration object 114A having first addresses 208 to a second configuration object 114B having second addresses 210 enables different clock controls for the model 106, whereas the TB environment 104 remains the same. As illustrated the template code 116 includes references to where the register information 212, 214 may apply, once compiled.

Figure 2B:
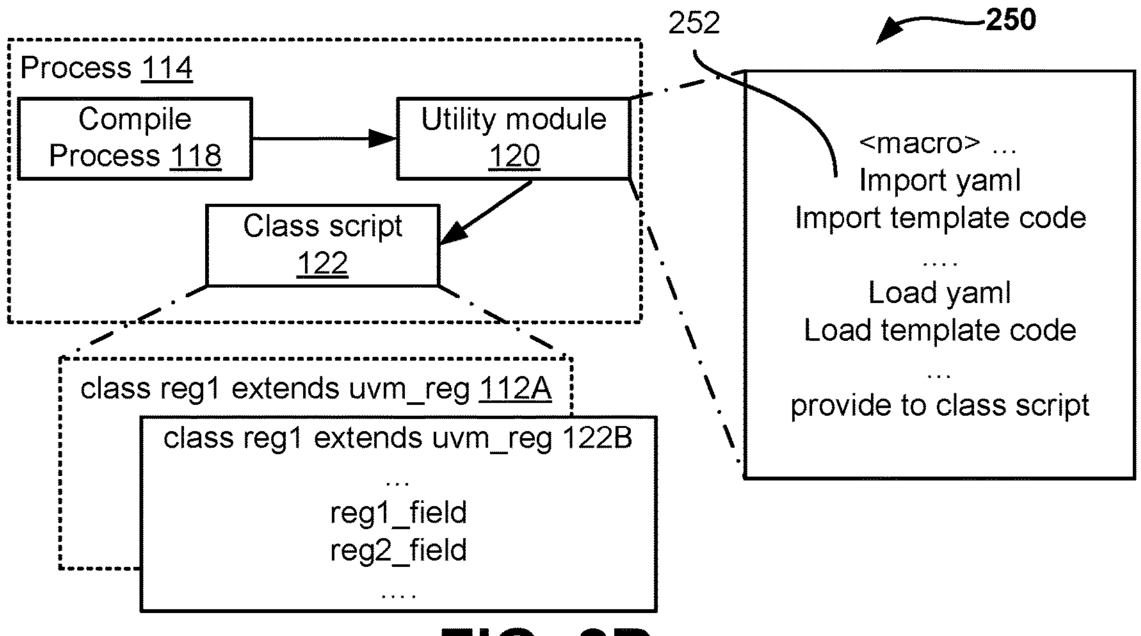
FIG. 2B illustrates further details associated with a system for seamless universal verification methodology, in accordance with at least one embodiment.

FIG. 2B illustrates a utility module and class script details 250 associated with a system for seamless UVM, in accordance with at least one embodiment. The utility module may be provided in instructions or code to be executed on at least one processor. The utility module 120 may be provided in Python® and imports from the template code 116 and the configuration object 114. A compile process 116 generates the class script 122 with various classes. Even though illustrated as a singular class script, it is understood the different classes and files of class script may be required to provide the TB environment 104 and the model 106.

Therefore, a template code 116 is associated with the testing or verification herein and includes at least specifications 212, 214 associated with the integrated circuit of the DUT 102. The compile process 116 compiles a utility module 120 to provide the class script 122 that includes the register model 106 and the TB environment 104 within the UVM 108. Further, the model 106 and the TB environment 106 are represented by a first class script 122A. The first class script 122A is therefore based in part on a utility module, which is, in turn, based in part on input from the template code 116 and from the configuration object 114. For example, the input may be provided by references 252 in the utility module 120.

FIG. 2B also illustrates that, upon a change determined in the configuration object 114 (such as by a new configuration object 114B from a prior configuration object 114A), the compile process may be caused to automatically generate a second class script 122B using the utility module 120, where the references 252 are the same, but rely on the different configuration object 114B. As such, the compile process is to automatically generate the second class script 122B based in part on the change in the configuration object, such as the change in the register information from initial addresses 208 to different addresses 210, as illustrated. The specifications 212, 214 in the template code, however, remain unchanged for the second class script 122B. The integrated circuit of the DUT 102 may be tested using the second class script 122B.

In at least one embodiment, the compile process 118 may cause automatic compilation of the utility module 120 every time a configuration object 114 is provided or loaded in the user-controlled interface 110. Further, the address map 126 can therefore include addresses 208; 210 and values (such as for the fields 204) for the registers 132 within an integrated circuit of the DUT 102. The change in the configuration object allows the second class script 122B to change a memory content of the memory 120 and an address map content of the address map 126 of the model 106, relative to the first class script 122A.

Figure 3:
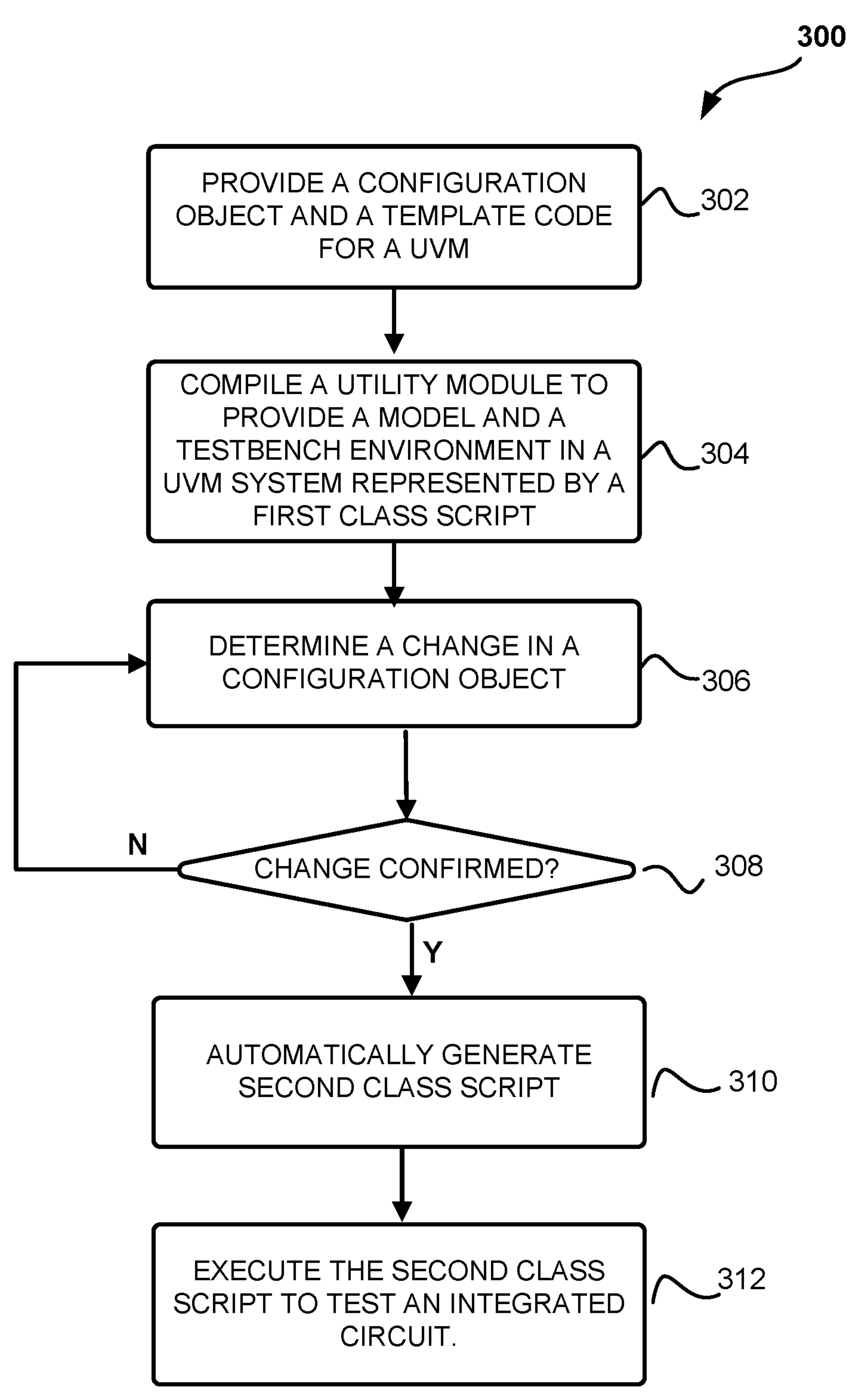
FIG. 3 illustrates a process flow or method associated with a system for seamless universal verification methodology, in accordance with at least one embodiment.

FIG. 3 illustrates a process flow or method 300 associated with a system for seamless UVM, in accordance with at least one embodiment. One or more steps in the method 300 may be performed on a client device or using a client device together with a cloud environment that is remote from the client device, as illustrated and described with respect to FIGS. 5-7. The method 300 includes providing (302) a configuration object and a template code for a UVM. A further step in the method 300 includes compiling (304) a utility module to provide a model and a TB environment within a system having the UVM. The system includes at least one processor and memory comprising instructions to provide the UVM for testing an integrated circuit of a DUT. The model and the TB environment are represented by different classes of a first class script. Further, the utility module is based in part on input from a template code and input from a configuration object. In addition, the configuration object includes an address map code and the TB environment includes agents to test an integrated circuit using the UVM system.

The method 300 further includes determining (306) that a change in the configuration object has occurred. In at least one embodiment, a compilation process can make such a determination based at least in part on a new configuration object loaded to a process section of a user-controller interface. The process section may be enabled by an active container or folder instance of a system for the UVM. Further, the method 300 includes confirming (308) that a change has occurred, which may be performed in part with the determination (306) step by comparison of code received to the active container or folder and providing an indication to cause a further compilation in step 310. The compilation in step 310 is a further compilation than initially performed in step 304. Particularly, in step 310, the compilation is an automatic compilation that automatically generates (310) a second class script using the utility module and based in part on the change in the configuration object. In doing so, specifications in the template code remain unchanged for the second class script, as it were in the first class script. The method 300 includes executing (312) the second class script to test the integrated circuit of the DUT.

Figure 4:
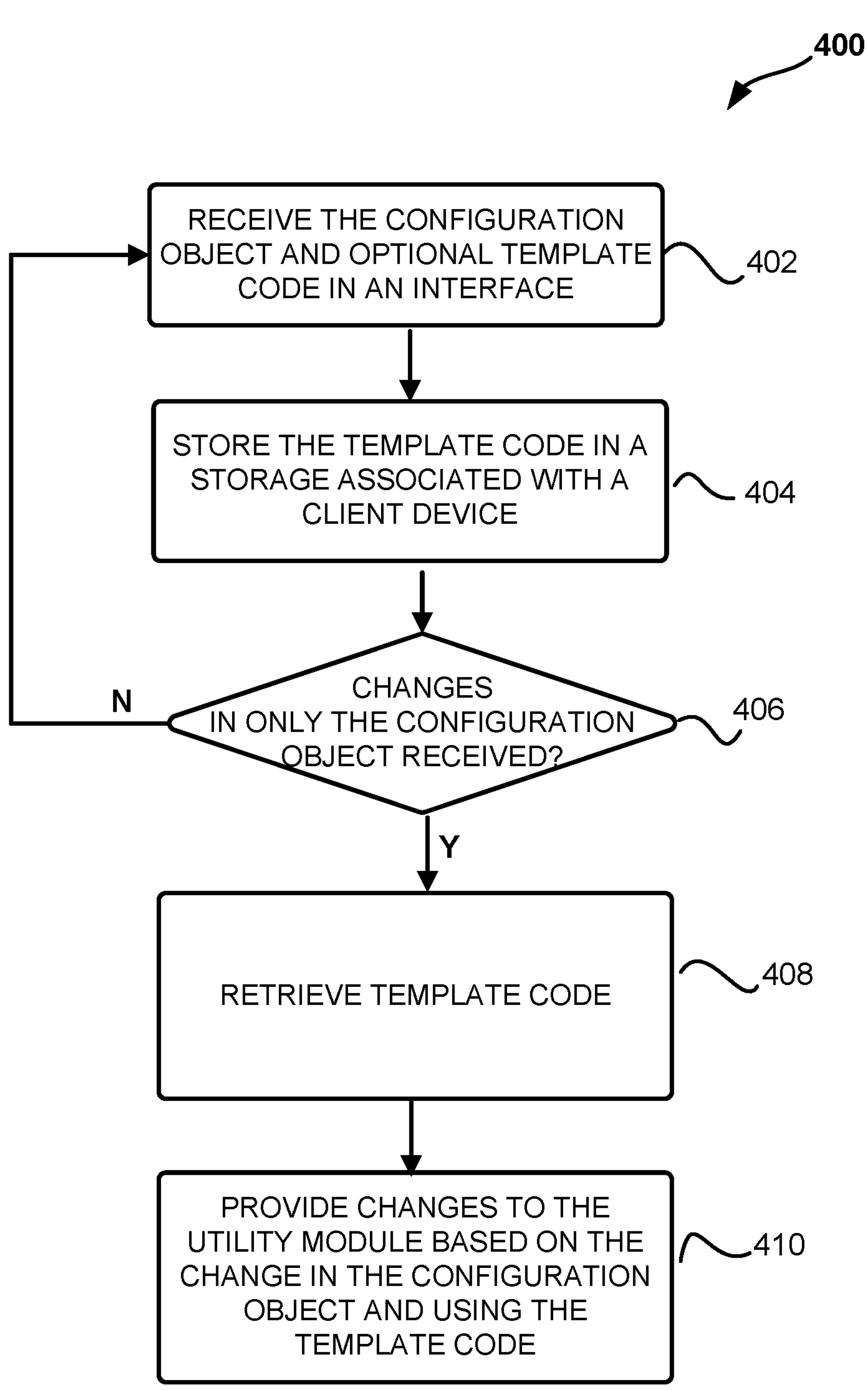
FIG. 4 illustrates another process flow or method associated with a system for seamless universal verification methodology, in accordance with at least one embodiment.

FIG. 4 illustrates another process flow or method 400 associated with a system for seamless UVM, in accordance with at least one embodiment. One or more steps in the method 400 may be performed on a client device or using a client device together with a cloud environment that is remote from the client device, as illustrated and described with respect to FIGS. 5-7. The process flow or method 400 includes receiving (402) the configuration object and the template code in an interface, such as the user-controlled interface in FIG. 1. The interface is associated with or is to be associated with the system providing the UVM. In a cloud environment, the interface may be a virtual interface in a computing instance of the cloud environment. Further, the system providing the UVM also includes cloud aspects, such as at least a bare metal or virtual component operating on the bare metal at a remote location than the client device.

The method 400 includes storing (404) the template code in a storage associated with a client device. In at least one embodiment, when the cloud environment is used, a cloud storage, such as in a remote location is provided. The method 400 also includes determining (406) that the change to the configuration object is received using the interface. This may be part of the determination step 306 in FIG. 3. The method 400 includes retrieving (408) the template code and providing (410) the changes to the utility module based in part on the change to the configuration object and using the template code. The providing step 410 may be performed by repeating the compiling with the changes to the utility module.

In at least one embodiment, the method 300, 400 are computer-implemented methods using the systems in FIGS. 1, 2, and 5-7. The configuration object includes a register transfer language (RTL) code or includes YAML Ain't Markup Language® code, while the specifications of the template code include SoC (System On Chip) or IP (Intellectual Property) block data for testing SoC or IP blocks associated with the integrated circuit. In at least one embodiment, the utility module is coded in Python®. Further, the utility module may include a macro-based utility to provide an expansion sequence within the template code. In at least one embodiment, the method 300, 400 provides the class script to include testing requirements for a CSR of the integrated circuit of a DUT. The method 300, 400 includes providing an address map in the configuration object. The address map includes addresses and values for registers within the integrated circuit of the DUT. Then, a change in the configuration object allows the second class script to change a memory content and an address map content of the model relative to the first class script, for testing the DUT. For example, the changes provide a different address map or provide differences in the address map for the integrated circuit.

Figure 5:
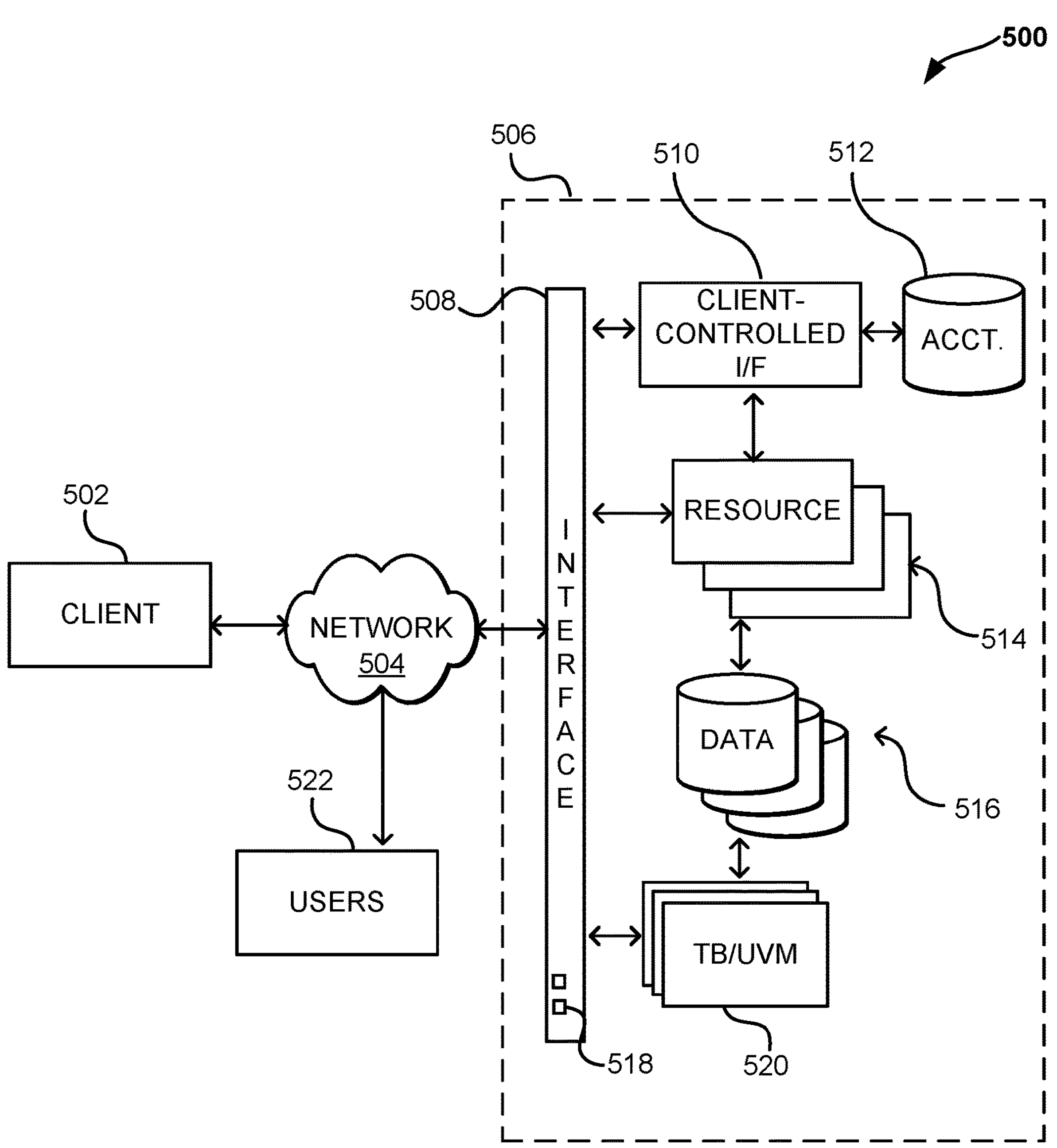
FIG. 5 illustrates an example network-inclusive computing environment in which aspects of various embodiments can be implemented.

FIG. 5 illustrates an example environment 500 in which aspect of various embodiments can be implemented. Such an environment can be used in some embodiments to provide a customer-controlled interface 510 and a TB/UVM 520 for one or more users, as part of a shared or multi-tenant resource environment, including a cloud environment. Therefore, aspects of the environment 500 may be in remote geographical location to enable a system for seamless UVM. For example, the provider environment 506 can be a cloud environment that can be used to provide cloud-based network connectivity for users 522 to perform the simulations if all aspects of the seamless UVM are performed via the cloud environment. The resources may also provide networking functionality for one or more client devices 502, such as personal computers, that may be able to connect to one or more network(s) 504 as discussed herein.

In at least one embodiment, a user is able to utilize a client device 102/502 to submit requests for a user-controller interface 110/510, across at least one network 504. The user-controller interface 110/510 may be part of a service provider environment 506. The client device can include any appropriate electronic device operable to send and receive requests, messages, or other such information over an appropriate network and convey information back to a user of the device. Examples of such client devices include personal computers, tablet computers, smart phones, notebook computers, and the like.

The at least one network 504 can include any appropriate network, including an intranet, the Internet, a cellular network, a local area network (LAN), or any other such network or combination, and communication over the network can be enabled via wired and/or wireless connections. The service provider environment 506 can include any appropriate components for receiving requests and returning information or performing actions in response to those requests. As an example, the service provider environment might include Web servers and/or application servers for receiving and processing requests, then returning data, Web pages, video, audio, or other such content or information in response to the request. The service provider environment can be secured such that only authorized users have permission to access those resources.

In various embodiments, a service provider environment 506 may include various types of resources that can be utilized by multiple users for a variety of different purposes. As used herein, computing and other electronic resources utilized in a network environment can be referred to as "network resources." These can include, for example, servers, databases, load balancers, routers, and the like, which can perform tasks such as to receive, transmit, and/or process data and/or executable instructions. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation.

In at least one embodiment, the service provider environment 506 includes a plurality of resources 514 of one or more types. These types can include, for example, application servers operable to process instructions provided by a user or database servers operable to process data stored in one or more data stores 516 in response to a user request. The application servers are also able to perform compilation, monitoring, and execution aspects described throughout in FIGS. 1-4 herein, for a seamless UVM. For such purposes, a user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 514 can submit a request that is received to an interface layer 508 of the service provider environment 506. The interface layer can include application programming interfaces (APIs) or other exposed interfaces 518 enabling a user to submit requests to the provider environment. The interface layer 508 in this example can also include other components as well, such as at least one Web server, routing components, load balancers, and the like. When a request to provision a resource is received to the interface layer 508, information for the request can be directed to a resource manager 510 or other such system, service, or component configured to manage customer accounts and information, resource provisioning and usage, and other such aspects. A resource manager 510 receiving the request can perform tasks such as to authenticate an identity of the user submitting the request, as well as to determine whether there is an existing account with the resource provider, where the account data may be stored in at least one data store 512 in the provider environment.

A user 522 may be different from a client 502. For example, the client 502 may provide certain VIP or DUT aspects, whereas the user 522 can provide the UVM aspects described throughout herein. In at least one embodiment, the user 522 or the client 502 can provide any of various types of credentials in order to authenticate an identity of the user to the provider. These credentials can include, for example, a username and password pair, biometric data, a digital signature, or other such information. The provider environment 506 can validate this information against information stored for the user or client.

When a user 522 or client 502 has an account with the appropriate permissions, status, etc., the resource manager can determine whether there are adequate resources available to suit the request made, and if so, can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user 522 or client 502 does not have a valid account with the provider, the account does not enable access to the type of resources specified in the request, or another such reason is preventing the user 522 or client 502 from obtaining access to such resources, a communication can be sent to the user 522 or client 502 to enable the user 522 or client 502 to create or modify an account, or change the resources specified in the request, among other such options.

In at least one embodiment, resources made available for use by a client device of the user 522 or client 502 can include servers and other resources 510, 520, each having at least one processor and memory. The memory includes instructions that when executed by the respective processors enable one or more of the aspects 102-110 in FIGS. 1, 2, herein, to provide computing instances for performing seamless UVM. Further, once a user 522 or client 502 is authenticated, the account verified, and the resources 514 allocated, the user 522 or client 502 can utilize the allocated resource(s) of a specified capacity, for an amount of data transfer, period of time, or other such value. In at least some embodiments, a user 522 or client 502 might provide a session token or other such credentials with subsequent requests in order to enable those requests to be processed on that session. The user 522 or client 502 can receive a resource identity, specific address, or other such information that can enable the client device to communicate with an allocated resource without having to communicate with the resource manager 510, at least until such time as a relevant aspect of the account changes, the customer or administrator is no longer granted access to the resource, or another such aspect changes.

One or more aspects of the client-controlled interface 510 or the TB/UVM 520 may include a virtual layer of hardware and software components that handles control functions in addition to management actions for the UVM. A resource manager may be associated can utilize dedicated APIs in the interface layer 508, where each API can be provided to receive requests for at least one specific action to be performed with respect to the provider environment 506, such as to initiate a UVM or to provide a DUT, as an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer 508 in at least one embodiment includes a scalable set of user-facing servers that can provide the various APIs and return the appropriate responses based on the API specifications. The interface layer also can include at least one API service layer that in one embodiment consists of stateless, replicated servers which process the externally facing user APIs. The interface layer can be responsible for Web service front end features such as authenticating users or administrators based on credentials, authorizing the user 522 or client 502, throttling requests to the API servers, validating input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, users 522 or clients 502 of the services provided herein. The servers of the Web services layer can be stateless and scaled horizontally as known in the art. API servers, as well as the persistent data store, can be spread across multiple data centers in a region, for example, such that the servers are resilient to single data center failures.

Figure 6:
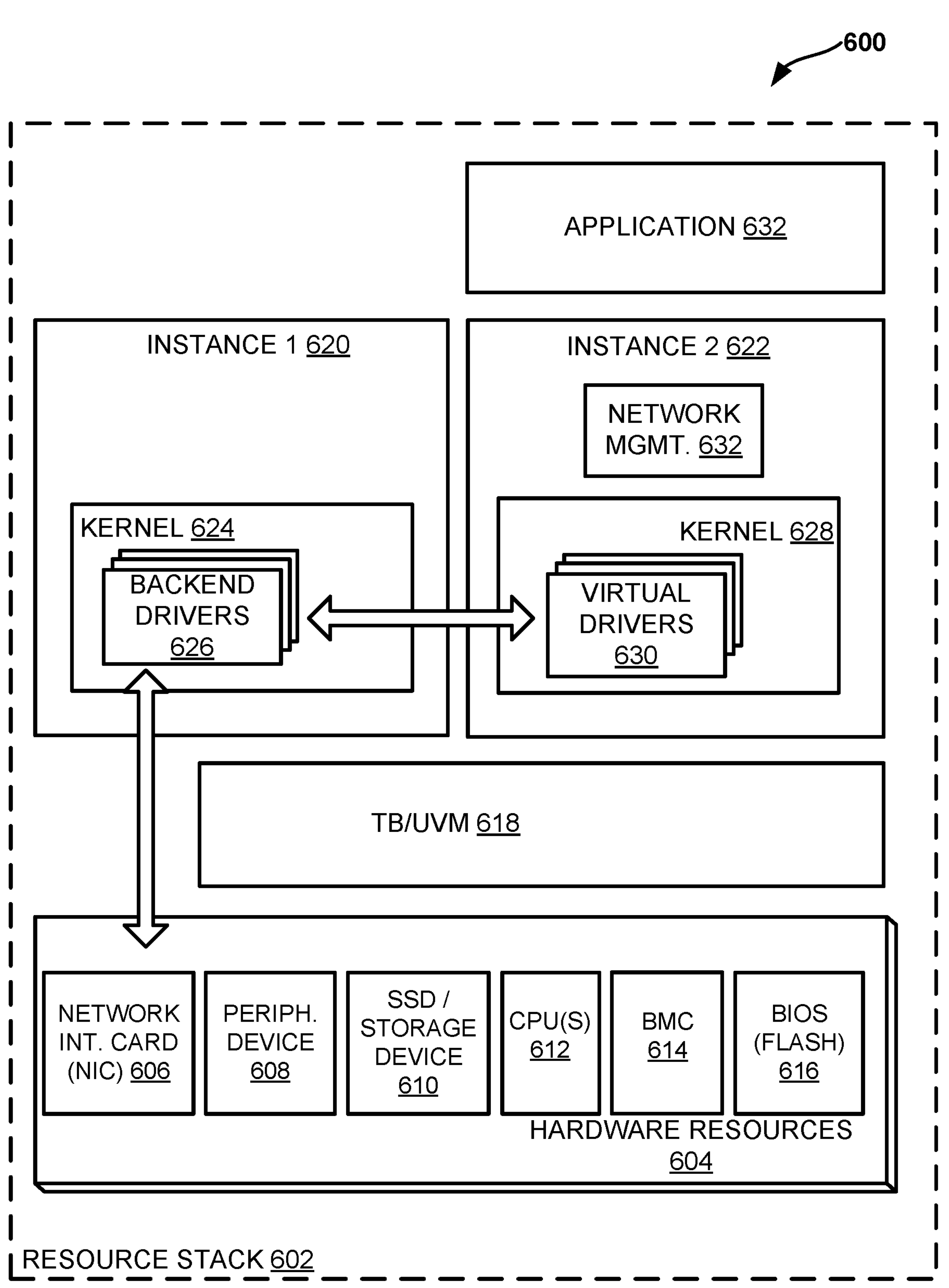
FIG. 6 illustrates example components of a server that can be utilized to perform at least a portion of a seamless universal verification methodology, in accordance with various embodiments.

FIG. 6 illustrates an example resource stack 602 of virtual and physical resources 600 that can be utilized in accordance with various embodiments, such as may be provided as part of a system for seamless UVM, such as illustrated at least in FIGS. 1 and 2. As described with respect to FIGS. 1 and 5, a user-controlled interface 110 may be supported by an application 632, for example, to receive input 112 and to perform one or more of the processes 114. Further, one or more of the processes may be performed on distinct instances 620, 622 that are associated with a TB/UVM 618. The resource stack 602 includes physical underlying resources, such as CPUs 612 for executing code to provide hardware aspects in support of virtual features of seamless UVM, such as in a cloud environment. The resource stack 602 may include network interface cards (NICs) 606 for communicating network traffic and memory 610 for storing instructions and networking data. In some embodiments, an entire machine may be allocated for these tasks, or only a portion of the machine, such as to allocate a portion of the resources as a virtual resource in an instance 620; 622 that can perform at least some of these tasks.

Such a resource stack 602 can be used to provide an allocated provider environment 506 for a user 522 or client 502 of a resource provider and having an operating system provisioned on the resource. In accordance with the illustrated embodiment, the resource stack 602 includes a number of hardware resources 604, such as one or more central processing units (CPUs) 612; solid state drives (SSDs) or other storage devices 610; a network interface card (NIC) 606, one or more peripheral devices (e.g., a graphics processing unit (GPU), etc.) 608, a BIOS implemented in flash memory 616, a baseboard management controller (BMC) 614, and the like.

In at least one embodiment, the hardware resources 604 reside on a single computing device (e.g., chassis). In at least one embodiment, the hardware resources can reside on multiple devices, racks, chassis, and the like. Running on top of the hardware resources 604, a virtual resource stack may include a virtualization layer for a TB/UVM 618, a first instance 620, and potentially also one or more instances 622 capable of executing at least one application 632. The TB/UVM 618, if utilized in a virtualized environment, enables execution on one or more guest operating systems; and multiple instances of different operating systems can share underlying hardware resources 604 to perform multiple tests using different TBs/UVMs.

An instance 620 or 622 can include one or more virtualized or para-virtualized drivers 630 and can include one or more backend device drivers 626. When the operating system (OS) kernel 628 of an instance wants to invoke an I/O operation, the virtualized driver 630 may perform the operation by way of communicating with the backend device driver 626. When the virtualized or para-virtualized drivers 630 wants to initiate an I/O operation (e.g., to send out a network packet), a kernel component can identify which physical memory buffer contains the packet (or other data) and the virtualized or para-virtualized drivers 630 can either copy the memory buffer to a temporary storage location in the kernel for performing I/O or obtain a set of pointers to the memory pages that contain the packet(s). In at least one embodiment, these locations or pointers are provided to the backend driver 626 of the host kernel 624 which can obtain access to the data and communicate it directly to the hardware device, such as the NIC 606 for sending the packet over the network.

It should be noted that the resource stack 602 illustrated in FIG. 6 is only one possible example of a set of resources that is capable of providing a virtualized computing environment and that the various embodiments described herein are not necessarily limited to this particular resource stack. In compute servers, a Board Management Controller (BMC) 614 can maintain a list of events that have occurred in the system, referred to herein as a system event log (SEL). In at least one embodiment, the BMC 614 can receive system event logs from the BIOS 616 on the host processor. The BIOS 616 can provide data for system events over an appropriate interface, such as an I2C interface, to the BMC using an appropriate protocol, such as an SMBus System Interface (SSIF) or KCS interface over LPC. As mentioned, an example of a system event log event from BIOS includes an uncorrectable memory error, indicating a bad RAM stick. In at least some embodiments, system event logs recorded by BMCs on various resources can be used for purposes such as to monitor server health, including triggering manual replacement of parts or instance degrade when SELs from the BIOS indicate failure.

In at least one embodiment, there will be portions of the physical resource 600 that will be inaccessible to the OS. This can include, for example, at least a portion of BIOS memory 616. BIOS memory 616 in at least one embodiment is volatile memory such that any data stored to that memory will be lost in the event of a reboot or power down event. The BIOS may keep at least a portion of host memory unmapped, such that it is not discoverable by a host OS. Computing resources, such as servers, smartphones, or personal computers, will generally include at least a set of standard components configured for general purpose operation, although various proprietary components and configurations can be used as well within the scope of the various embodiments. As mentioned, this may include client devices for transmitting and receiving network communications, or servers for performing tasks such as network analysis and rerouting, among other such options.

Figure 7:
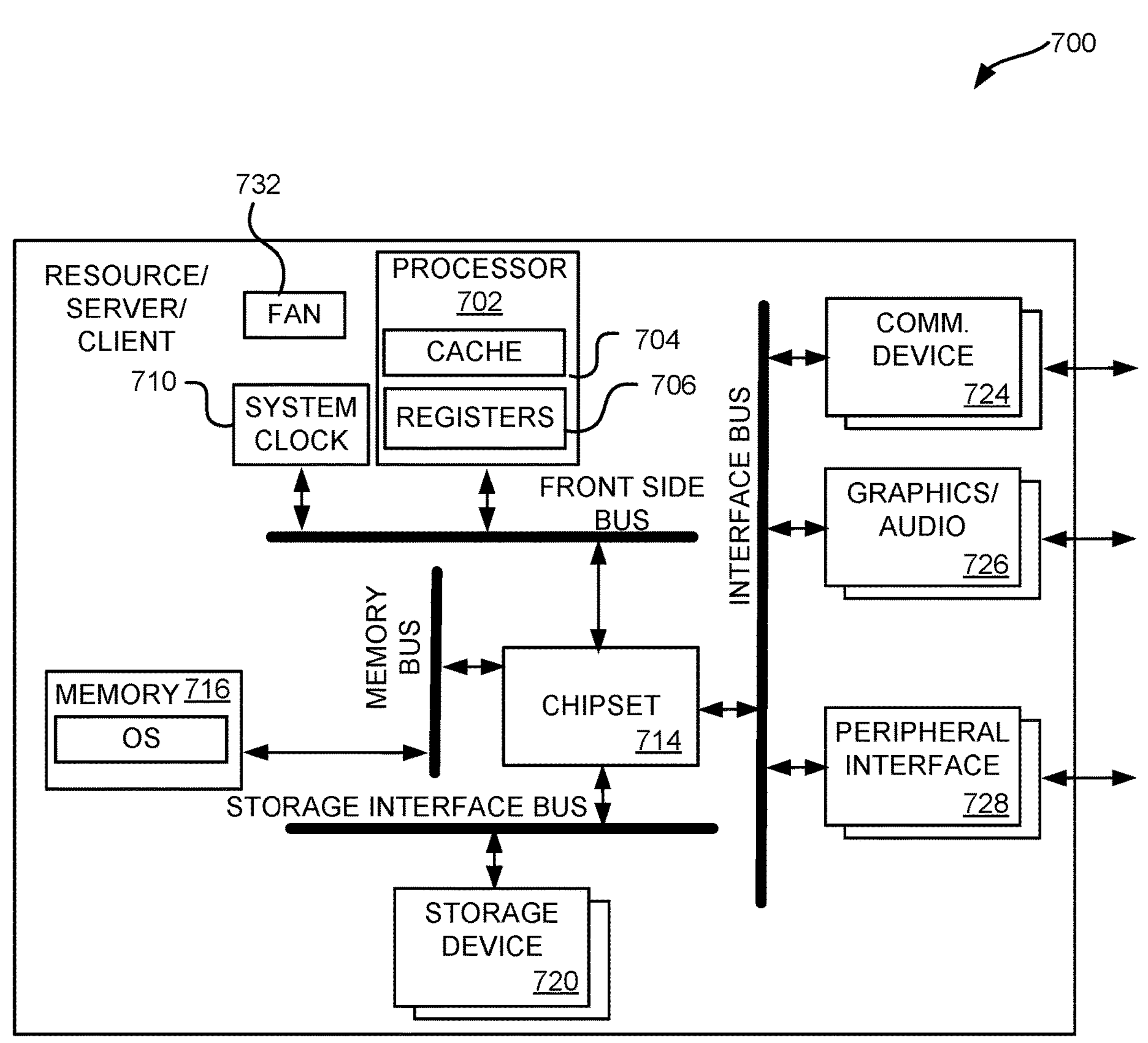
FIG. 7 illustrates example components of a computing device that can be used to implement aspects of various embodiments.

FIG. 7 illustrates components of an example computing resource 700 that can be utilized in accordance with various embodiments. It should be understood that there can be many such compute resources and many such components provided in various arrangements, such as in a local network or across the Internet or "cloud," to provide compute resource capacity as discussed elsewhere herein. The computing resource 700 (e.g., a desktop or network server) will have one or more processors 702, such as central processing units (CPUs), graphics processing units (GPUs), and the like, that are electronically and/or communicatively coupled with various components using various buses, traces, and other such mechanisms.

A processor 702 can include memory registers 706 and cache memory 704 for holding instructions, data, and the like. In this example, a chipset 714, which can include a northbridge and southbridge in some embodiments, can work with the various system buses to connect the processor 702 to components such as system memory 716, in the form of physical RAM or ROM, which can include the code for the operating system as well as various other instructions and data utilized for operation of the computing device. The computing device can also contain, or communicate with, one or more storage devices 720, such as hard drives, flash drives, optical storage, and the like, for persisting data and instructions similar, or in addition to, those stored in the processor and memory.

The processor 702 can also communicate with various other components via the chipset 714 and an interface bus (or graphics bus, etc.), where those components can include communications devices 724 such as cellular modems or network cards, media components 726, such as graphics cards and audio components, and peripheral interfaces 728 for connecting peripheral devices, such as printers, keyboards, and the like. At least one cooling fan 732 or other such temperature regulating or reduction component can also be included as well, which can be driven by the processor or triggered by various other sensors or components on, or remote from, the device. Various other or alternative components and configurations can be utilized as well as known in the art for computing devices.

At least one processor 702 can obtain data from physical memory 716, such as a dynamic random access memory (DRAM) module, via a coherency fabric in some embodiments. It should be understood that various architectures can be utilized for such a computing device, that may include varying selections, numbers, and arguments of buses and bridges within the scope of the various embodiments. The data in memory may be managed and accessed by a memory controller, such as a DDR controller, through the coherency fabric. The data may be temporarily stored in a processor cache 704 in at least some embodiments. The computing device 700 can also support multiple I/O devices using a set of I/O controllers connected via an I/O bus. There may be I/O controllers to support respective types of I/O devices, such as a universal serial bus (USB) device, data storage (e.g., flash or disk storage), a network card, a peripheral component interconnect express (PCIe) card or interface 728, a communication device 724, a graphics or audio card 726, and a direct memory access (DMA) card, among other such options. In some embodiments, components such as the processor, controllers, and caches can be configured on a single card, board, or chip (i.e., a system-on-chip implementation), while in other embodiments at least some of the components may be located in different locations, etc.

An operating system (OS) running on the processor 702 can help to manage the various devices that may be utilized to provide input to be processed. This can include, for example, utilizing relevant device drivers to enable interaction with various I/O devices, where those devices may relate to data storage, device communications, user interfaces, and the like. The various I/O devices will typically connect via various device ports and communicate with the processor and other device components over one or more buses. There can be specific types of buses that provide for communications according to specific protocols, as may include peripheral component interconnect) PCI or small computer system interface (SCSI) communications, among other such options. Communications can occur using registers associated with the respective ports, including registers such as data-in and data-out registers. Communications can also occur using address mapped I/O, where a portion of the address space of a processor is mapped to a specific device, and data is written directly to, and from, that portion of the address space.

Such a device may be used, for example, as a server in a server farm or data warehouse. Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application specific integrated circuit (ASIC) comprising digital logic operable to send and receive packets.

In an illustrative embodiment, a host computing device is associated with various hardware components, software components and respective configurations that facilitate the execution of I/O requests. One such component is an I/O adapter that inputs and/or outputs data along a communication channel. In one aspect, the I/O adapter device can communicate as a standard bridge component for facilitating access between various physical and emulated components and a communication channel. In another aspect, the I/O adapter device can include embedded microprocessors to allow the I/O adapter device to execute computer executable instructions related to the implementation of management functions or the management of one or more such management functions, or to execute other computer executable instructions related to the implementation of the I/O adapter device. In some embodiments, the I/O adapter device may be implemented using multiple discrete hardware elements, such as multiple cards or other devices.

A management controller can be configured in such a way to be electrically isolated from any other component in the host device other than the I/O adapter device. In some embodiments, the I/O adapter device is attached externally to the host device. In some embodiments, the I/O adapter device is internally integrated into the host device. Also, in communication with the I/O adapter device may be an external communication port component for establishing communication channels between the host device and one or more network-based services or other network-attached or direct-attached computing devices. Illustratively, the external communication port component can correspond to a network switch, sometimes known as a Top of Rack ("TOR") switch. The I/O adapter device can utilize the external communication port component to maintain communication channels between one or more services and the host device, such as health check services, financial services, and the like.

The I/O adapter device can also be in communication with a Basic Input/Output System (BIOS) component. The BIOS component can include non-transitory executable code, often referred to as firmware, which can be executed by one or more processors and used to cause components of the host device to initialize and identify system devices such as the video display card, keyboard and mouse, hard disk drive, optical disc drive and other hardware. The BIOS component can also include or locate boot loader software that will be utilized to boot the host device. For example, in one embodiment, the BIOS component can include executable code that, when executed by a processor, causes the host device to attempt to locate Preboot Execution Environment (PXE) boot software. Additionally, the BIOS component can include or takes the benefit of a hardware latch that is electrically controlled by the I/O adapter device. The hardware latch can restrict access to one or more aspects of the BIOS component, such controlling modifications or configurations of the executable code maintained in the BIOS component. The BIOS component can be connected to (or in communication with) a number of additional computing device resources components, such as processors, memory, and the like.

In one embodiment, such computing device resource components may be physical computing device resources in communication with other components via the communication channel. The communication channel can correspond to one or more communication buses, such as a shared bus (e.g., a front side bus, a memory bus), a point-to-point bus such as a PCI or PCI Express bus, etc., in which the components of the bare metal host device communicate. Other types of communication channels, communication media, communication buses or communication protocols (e.g., the Ethernet communication protocol) may also be utilized. Additionally, in other embodiments, one or more of the computing device resource components may be virtualized hardware components emulated by the host device. In such embodiments, the I/O adapter device can implement a management process in which a host device is configured with physical or emulated hardware components based on a variety of criteria. The computing device resource components may be in communication with the I/O adapter device via the communication channel. In addition, a communication channel may connect a PCI Express device to a CPU via a northbridge or host bridge, among other such options.

In communication with the I/O adapter device via the communication channel may be one or more controller components for managing hard drives or other forms of memory. An example of a controller component can be a SATA hard drive controller. Similar to the BIOS component, the controller components can include or take the benefit of a hardware latch that is electrically controlled by the I/O adapter device. The hardware latch can restrict access to one or more aspects of the controller component. Illustratively, the hardware latches may be controlled together or independently. For example, the I/O adapter device may selectively close a hardware latch for one or more components based on a trust level associated with a particular user. In another example, the I/O adapter device may selectively close a hardware latch for one or more components based on a trust level associated with an author or distributor of the executable code to be executed by the I/O adapter device. In a further example, the I/O adapter device may selectively close a hardware latch for one or more components based on a trust level associated with the component itself. The host device can also include additional components that are in communication with one or more of the illustrative components associated with the host device. Such components can include devices, such as one or more controllers in combination with one or more peripheral devices, such as hard disks or other storage devices. Additionally, the additional components of the host device can include another set of peripheral devices, such as Graphics Processing Units ("GPUs"). The peripheral devices and can also be associated with hardware latches for restricting access to one or more aspects of the component. As mentioned above, in one embodiment, the hardware latches may be controlled together or independently.

As discussed, different approaches can be implemented in various environments in accordance with the described embodiments. As will be appreciated, although a network- or Web-based environment is used for purposes of explanation in several examples presented herein, different environments may be used, as appropriate, to implement various embodiments. Such a system can include at least one electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers, and the like.

The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks, an alternative device serving a similar purpose could be used, as would be apparent to one of ordinary skill in the art.

The illustrative environment includes at least one application server and a data store. It should be understood that there can be several application servers, layers, or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed, or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML, or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

The data store can include several separate data tables, databases, or other data storage mechanisms and media for storing data relating to a particular aspect. For example, the data store illustrated includes mechanisms for storing content (e.g., production data) and user information, which can be used to serve content for the production side. The data store is also shown to include a mechanism for storing log or session data. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the application server and obtain, update, or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of the systems herein should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially available operating systems and other known applications for purposes such as development and database management. These devices can also include other electronic devices, such as dummy terminals, thin-clients, gaming systems, and other devices capable of communicating via a network.

Most embodiments utilize at least one network that would be familiar to those skilled in the art for supporting communications using any of a variety of commercially available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer, or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules, or other data, including RAM, ROM, EEPROM, flash memory, or other memory technology, CD-ROM, digital versatile disk (DVD), or other optical storage, magnetic cassettes, magnetic tape, magnetic disk storage, or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system, comprising:

at least one processor and memory comprising instructions that when executed by the at least one processor causes the system to:

receive a configuration object comprising an address map code, the configuration object to be used to test an integrated circuit using Universal Verification Methodology (UVM);

enable a template code to be associated with the testing and comprising at least specifications associated with the UVM;

compile a utility module to provide a model and a testbench environment within the UVM, the model and the testbench environment represented by a first class script and the utility module based in part on input from the template code and from the configuration object;

determine a change in the configuration object;

automatically generate a second class script using the utility module and based in part on the change in the configuration object, wherein the specifications remain unchanged for the second class script; and test the integrated circuit using the second class script.

2. The system of claim 1, wherein the address map code comprises a register transfer language (RTL) code or comprises YAML Ain't Markup Language® code.

3. The system of claim 1, wherein the specifications comprise SoC (System On Chip) or IP (Intellectual Property) block data for testing SoC or IP blocks associated with the integrated circuit.

4. The system of claim 1, wherein the first class script and the second class script each comprise testing requirements within the model and within the testbench environment for a control and status register (CSR) of the integrated circuit.

5. The system of claim 1, wherein the utility module comprises a macro-based utility to provide an expansion sequence within the template code.

6. The system of claim 1, wherein the address map comprises addresses and values for a plurality of registers within the integrated circuit and wherein the change in the configuration object allows the second class script to change a memory content and an address map content of the model relative to the first class script.

7. A computer-implemented method comprising:

compiling a utility module to provide a model and a testbench environment within a Universal Verification Methodology (UVM) system, the model and the testbench environment represented by different classes of a first class script and the utility module based in part on input from a template code and input from a configuration object, the configuration object comprising an address map code and the testbench environment comprising agents to test an integrated circuit using the UVM system;

determining a change in the configuration object;

automatically generating a second class script using the utility module and based in part on the change in the configuration object, wherein specifications in the template code and associated with the UVM system remain unchanged for the second class script; and providing the second class script for execution to test the integrated circuit.

8. The computer-implemented method of claim 7, wherein the configuration object comprises a register transfer language (RTL) code or comprises YAML Ain't Markup Language® code.

9. The computer-implemented method of claim 7, wherein the specifications comprise SoC (System On Chip) or IP (Intellectual Property) block data for testing SoC or IP blocks associated with the integrated circuit.

10. The computer-implemented method of claim 7, wherein the first class script and the second class script comprise testing requirements for a control and status register (CSR) of the integrated circuit.

11. The computer-implemented method of claim 7, wherein the utility module comprises a macro-based utility to provide an expansion sequence within the template code.

12. The computer-implemented method of claim 7, wherein the address map comprises addresses and values for a plurality of registers within the integrated circuit and wherein the change in the configuration object allows the second class script to change a memory content and an address map content of the model relative to the first class script.

13. The computer-implemented method of claim 7, further comprising:

receiving the configuration object and the template code in an interface that is associated with or to be associated with the UVM system;

storing the template code in a storage associated with a client device;

receiving the change to the configuration object using the interface; and providing the changes to the utility module based in part on the change to the configuration object and using the template code from the storage by repeating the compiling with the changes to the utility module.

14. The computer-implemented method of claim 7, wherein the changes provide a different address map or provide differences in the address map for the integrated circuit.

15. The computer-implemented method of claim 7, further comprising:

overwriting memory contents and address map contents of the UVM system based in part on the changes to the configuration object, wherein classes associated with the memory contents and the address map contents of the second class script provide new memory contents and a new address map to be used with the testbench environment.

16. A non-transitory computer-storage medium storing instructions configured to instruct at least one processor to:

compile a utility module to provide a model and a testbench environment within a Universal Verification Methodology (UVM) system, the model and the testbench environment represented by different classes of a first class script and the utility module based in part on input from a template code and input from a configuration object, the configuration object comprising an address map code and the testbench environment comprising agents to test an integrated circuit using the UVM system;

determine a change in the configuration object;

automatically generate a second class script using the utility module and based in part on the change in the configuration object, wherein specifications in the template code and associated with the UVM system remain unchanged for the second class script; and execute the second class script within the UVM environment to test the integrated circuit.

17. The non-transitory computer-storage medium of claim 16, wherein the instructions configured to further instruct the at least one processor to:

overwrite memory contents and address map contents of the UVM system based in part on the changes to the configuration object, wherein classes associated with the memory contents and the address map contents of the second class script provide new memory contents and a new address map to be used with the testbench environment.

18. The non-transitory computer-storage medium of claim 16, wherein the instructions configured to further instruct the at least one processor to:

receive the configuration object and the template code in an interface that is associated with or to be associated with the UVM system;

store the template code in a storage associated with a client device;

receive the change to the configuration object using the interface; and provide the changes to the utility module based in part on the change to the configuration object and using the template code from the storage by repeating the compiling with the changes to the utility module.

19. The non-transitory computer-storage medium of claim 16, wherein the address map comprises addresses and values for a plurality of registers within the integrated circuit and wherein the change in the configuration object allows the second class script to change a memory content and an address map content of the model relative to the first class script.

20. The non-transitory computer-storage medium of claim 16, wherein the utility module comprises a macro-based utility to provide an expansion sequence within the template code.

* * * * *